United States Patent [19]
Murai

[11] Patent Number: 5,473,184
[45] Date of Patent: Dec. 5, 1995

[54] SEMICONDUCTOR DEVICE AND METHOD FOR FABRICATING SAME

[75] Inventor: Ichiro Murai, Sagamihara, Japan

[73] Assignee: Nippon Steel Corporation, Tokyo, Japan

[21] Appl. No.: 204,599

[22] Filed: Mar. 2, 1994

[30] Foreign Application Priority Data

Mar. 5, 1993 [JP] Japan .................. 5-070939

[51] Int. Cl.⁶ .................. H01L 29/78; H01L 21/265
[52] U.S. Cl. .................. 257/382; 257/336; 257/344; 257/377; 257/408; 257/412; 437/43; 437/162; 437/203; 437/233
[58] Field of Search .................. 257/377, 382, 257/412, 336, 344, 408; 437/43, 162, 203, 233

[56] References Cited

U.S. PATENT DOCUMENTS 5,290,720  3/1994  Chen .................. 257/377

FOREIGN PATENT DOCUMENTS 63-144573  6/1988  Japan .
2-58374    2/1990  Japan .
2-174236   7/1990  Japan .
4-234131   8/1992  Japan .
4-234132   8/1992  Japan .

*Primary Examiner*—Edward Wojciechowicz
*Attorney, Agent, or Firm*—Pollock, Vande Sande & Priddy

[57] ABSTRACT

A semiconductor device comprises a semiconductor substrate of a first conductivity type and a pair of spaced diffused layers of a second conductivity type different from the first conductivity type formed in surface portions of the semiconductor substrate. A gate electrode is formed on a channel region between the pair of diffused layers in the semiconductor substrate with an intermediate gate oxide layer disposed therebetween, and then a silicon dioxide film is formed to cover an upper surface and side surfaces of the gate electrode and surface portions of the substrate in which the pair of diffused layers is formed. A side wall made of polycrystalline silicon is formed to cover the silicon dioxide film on each of the side surfaces of the gate electrode and an interlayer insulating film is formed to cover the silicon dioxide film, the side wall and the substrate. Then, a contact hole is formed through the interlayer insulating film to reach one of the pair of diffused layers, wherein a part of the side wall is exposed within the contact hole and a surface of the exposed part of the side wall is oxidized.

9 Claims, 3 Drawing Sheets

SEMICONDUCTOR DEVICE AND METHOD FOR FABRICATING SAME

BACKGROUND OF THE INVENTION

1. Field of the Invention

The present invention relates to a semiconductor device and in particular to a semiconductor device having extremely fine dimensions suitable for high density integration and to a method for fabricating same.

2. Description of the Related Art

In a prior art method for fabricating a semiconductor device having a gate electrode and a pair of spaced impurity diffused layers serving as a drain layer and a source layer, as disclosed for example in JP-A-63-144,573, 2-58,374, 2-174, 236, 4-234,131, 4-234,132, a side wall made of oxide is formed on the side surfaces of the gate electrode and an insulating film is formed so as to cover the surface of the side wall. Thereafter the insulating film is subjected to anisotropic etching in order to form a contact hole reaching one of the diffused layers through the insulating film so that the side wall is not etched. Then a conductive layer made of a conductive material electrically connected with the diffused layer through the contact hole is formed so as to extend on the insulating film.

However, if the distance between the contact hole and the gate electrode is decreased in order to make the semiconductor device still finer, the side wall is also etched, when the insulating film is subjected to anisotropic etching for forming the contact hole until the diffused layer is exposed, which gives rise to a problem that leak current from the gate electrode to the conductive layer through the contact hole is produced.

SUMMARY OF THE INVENTION

The object of the present invention is to provide a semiconductor device and a method for fabricating same, in which no leak current occurs from the gate electrode to the conductive layer through the contact hole, by solving the problem of the prior art techniques described above, even if the distance between the contact hole and the gate electrode is decreased, in order to make the semiconductor device still finer, in such a manner that a part of the side wall is etched, when the insulating film is subjected to anisotropic etching for forming the contact hole.

In order to achieve the above object, the semiconductor device according to the present invention comprises a semiconductor substrate having a first conductivity type; a pair of spaced diffused layers having a second conductivity type different from the first conductivity type formed in a surface portion of the semiconductor substrate; a gate electrode formed on a channel region between the pair of diffused layers in the semiconductor substrate through a gate oxide layer; a silicon dioxide film formed so as to cover an upper surface and side surfaces of the gate electrode and a part of a surface of the substrate, in which the pair of diffused layers are formed; and a side wall made of polycrystalline silicon, at least a surface of which is oxidized, formed on the silicon dioxide film on the side surfaces of the gate electrode.

Each of the pair of diffused layers includes preferably a low impurity concentration diffused layer on the inner side, which is close to the channel region, and a high impurity concentration diffused layer on the outer side, which is distant from the channel region.

Further it is preferable that the oxidized part of the surface of the side wall made of polycrystalline silicon is formed by thermal oxidation.

The method for making the semiconductor device according to the present invention comprises forming a gate electrode on a first region in a semiconductor substrate having a first conductivity type through a gate oxide layer and forming diffused layers having a second conductivity type different from the first conductivity type in a pair of second layers with the first region interposed therebetween in the substrate; forming a silicon dioxide film and a polycrystalline silicon film one after another on an upper surface and two side surfaces of the gate electrode and on the pair of second regions in the substrate and forming a side wall by etching away parts of the polycrystalline silicon film other than parts on the two side surfaces of the gate electrode; forming an interlayer insulating film on the silicon dioxide film and the polycrystalline silicon film and forming a contact hole reaching one of the second regions in the substrate through the interlayer insulating film so as to expose a part of the side wall therein; and a fourth step for forming a silicon dioxide film on the surface of the part of the side wall exposed within the contact hole by oxidation.

In the second step the polycrystalline silicon film may includes impurity.

It is preferable to form a low impurity concentration diffused layer having the second conductivity type in each of the pair of second regions in the first step and form a high impurity concentration diffused layer having the second conductivity type on the outer side of the low impurity concentration diffused layer, distant from the first region in the substrate.

The semiconductor device according to the present invention comprises impurity diffused layers formed in a pair of spaced regions in a surface portion of a semiconductor substrate, which layers have a conductivity type different from a conductivity type of the substrate; a gate oxide film formed on the semiconductor substrate, in which these diffused layers are formed; a gate electrode formed on a part of the gate oxide film corresponding to a channel region between the pair of diffused layers; a silicon dioxide film formed so as to cover an upper surface and side surfaces of the gate electrode, which silicon dioxide film extends also on the gate oxide film; and a side wall made of polycrystalline silicon, whose surface is oxidized, formed on the gate oxide film covering the side surfaces of the gate electrode.

In this case, the pair of diffused layers includes preferably a pair of low impurity concentration diffused layers and a pair of high impurity concentration diffused layers disposed on the outer side of the pair of low impurity concentration diffused layers, distant from the channel region, these diffused layers having a conductivity type opposite to the conductivity type of the substrate.

Further the oxidized part of the side wall is preferably formed by thermal oxidation.

According to the present invention it is possible to obtain an etching selectivity ratio greater than 10:1 between the interlayer insulating film and the side wall by using polycrystalline silicon for the side wall and to prevent the side wall being wholly etched away, before the surface of the substrate is exposed, at forming the contact hole by subjecting the interlayer insulating film to a fine processing.

Further, by forming an oxide film by oxidizing the side wall exposed within the contact hole after the formation of the contact hole, the occurrence of the leak current between the gate electrode and witing formed later is prevented. By this method the dimensions of the space between the gate electrode and the contact hole can be smaller than those determined by an alignment precision of an exposing apparatus.

DESCRIPTION OF THE PREFERRED EMBODIMENTS

Figure 1:
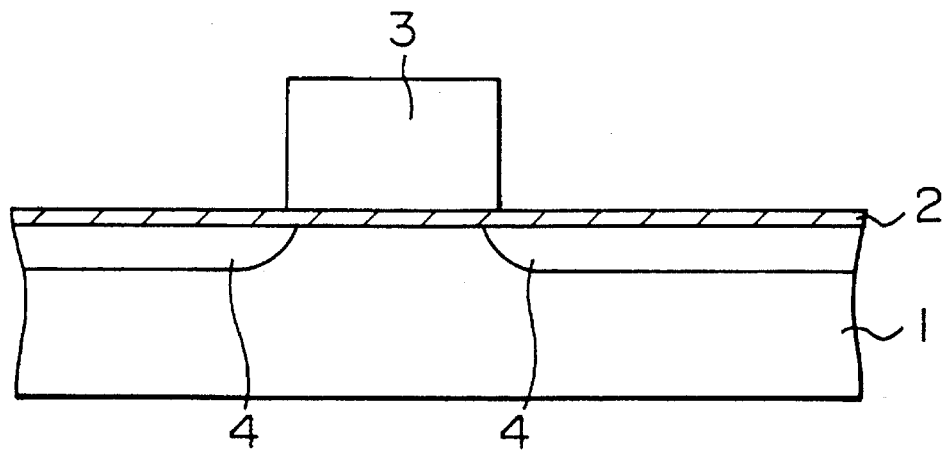
FIGS. 1 to 7 are cross-sectional views of intermediate products in different fabrication steps of the method for fabricating a semiconductor device according to an embodiment of the present invention.

Hereinbelow an embodiment of the present invention will be explained, referring to FIGS. 1 to 7.

At first an active element region is formed by the well-known LOCOS method on a surface of a p conductivity type semiconductor silicon substrate 1 having a specific resistivity 1 to 15 $\Omega \cdot cm$. Then a gate oxide film 2 is formed by the well-known thermal oxidation method so as to be 10 to 50 nm thick and thereafter a polycrystalline silicon film 3 is formed on the gate oxide film 2 by the chemical vapor deposition method to a thickness of about 200 to 350 nm thick. Next phosphor P ions are introduced into the polycrystalline silicon film 3 for example at about $4 \sim 6 \times 10^{20}$ atms/cm$^3$ as impurities by the thermal diffusion or doping method.

Then the polycrystalline silicon film 3 is formed in a predetermined shape by the well-known fine processing method to obtain a gate electrode 3. Next phosphor ions P are implanted in a surface portion of the semiconductor substrate, using the gate electrode as a mask, at an energy of 30 keV and at a dose of $1 \sim 5 \times 10^{13}$ ions/cm$^2$ by the well-known ion implantation method to obtain an n conductivity type diffused layer (FIG. 1).

Figure 2:
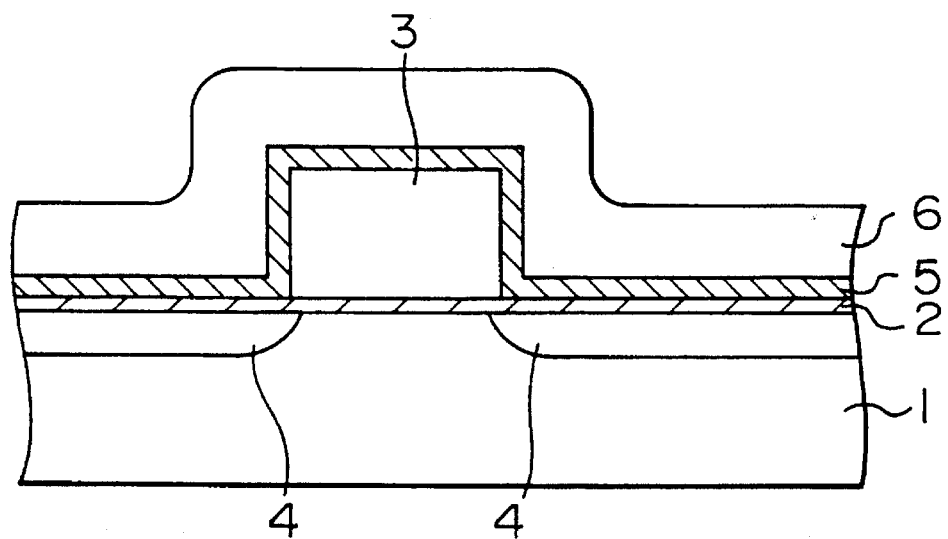

Thereafter a silicon dioxide film 5 is formed on the gate electrode 3 and then a polycrystalline silicon film 6 is formed further thereon by the chemical vapor deposition method having a thickness of about 50 to 150 nm and 150 to 300 nm thick, respectively (FIG. 2).

The silicon dioxide film 5 serves as an etching stopping film for the gate electrode 3, when the polycrystalline silicon film 6 is subjected later to etching processing. Phosphor ions P may be diffused into the polycrystalline silicon film 6 as impurities.

Next a side wall 6 is formed by the well-known anisotropic etching method. At this time, an etching selectivity ratio with respect to the polycrystalline silicon film 6 and the silicon dioxide film 5 is made greater than 10:1, by using $SF_6+Cl_2$ gas, as etching gas, and the silicon dioxide film 5 serves as the etching stopper, so that it is prevented that the gate electrode 3 is etched.

Figure 3:
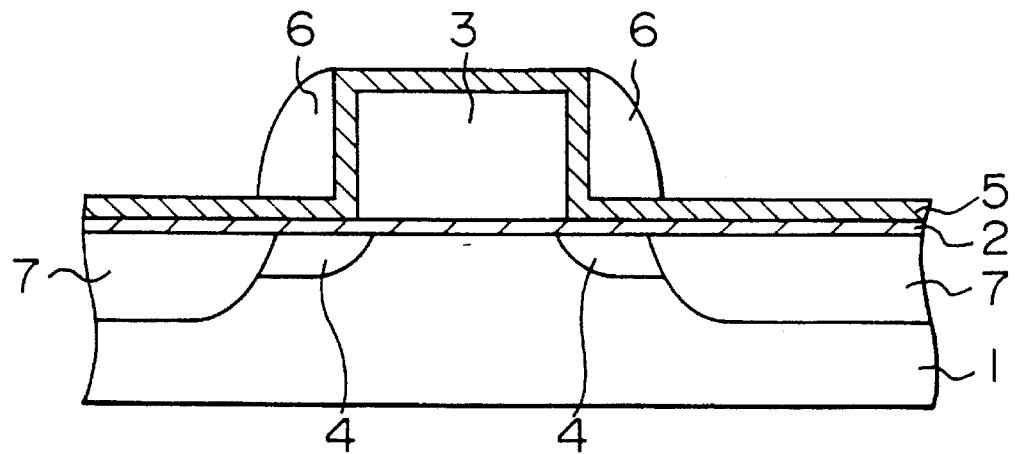

Then arsenic ions As or phosphor ions P are implanted in the semiconductor substrate 1 by the well-known ion implantation method under a condition of an energy of 30 to 90 keV and a dose of $1 \times 10^{15}$ to $1 \times 10^{16}$ ions/cm$^2$ to form a source and a drain diffused layer, as indicated in FIG. 3.

Thereafter a silicon dioxide film is formed on the semiconductor device indicated in FIG. 3 by the well-known chemical vapor deposition method to a thickness of about 100 to 200 nm to obtain an interlayer insulating film 8. Then, as indicated in FIG. 4, a contact hole 9 is formed in the interlayer insulating film 8 by the well-known fine processing method.

Figure 4:
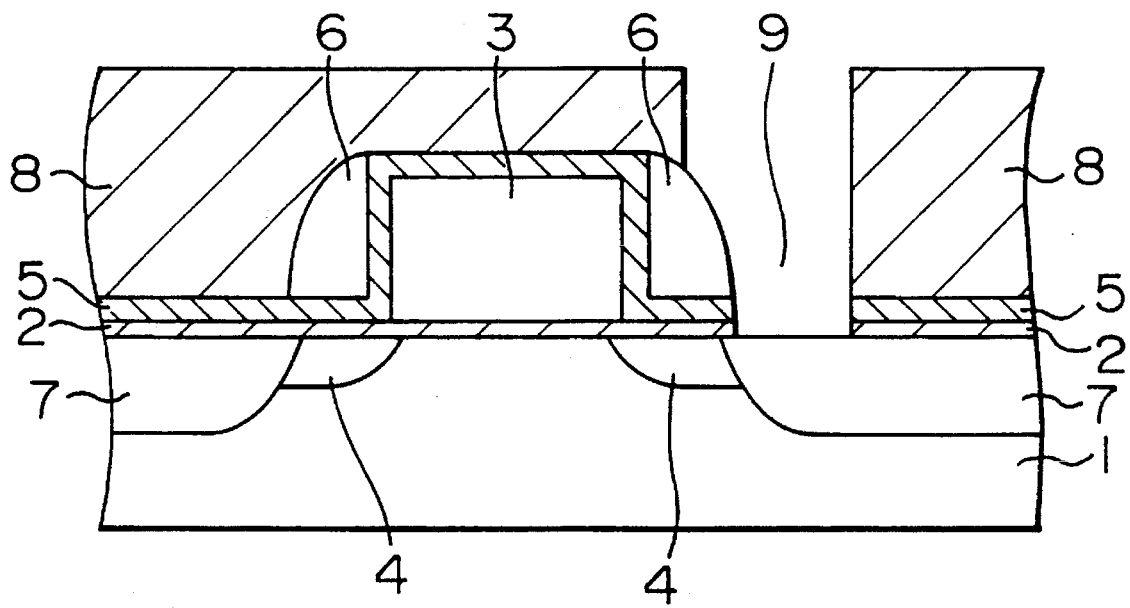

FIG. 4 represents a state, in which the contact hole 9 is overlapped with the side wall in order to decrease alignment margin for the space between the gate electrode 3 and the contact hole 9 required because of alignment precision of an exposing apparatus or for increasing the degree of integration.

Further, at the etching for forming the contact hole 9, an etching selectivity ratio with respect to the silicon dioxide film serving as the interlayer insulating film 8 and the polycrystalline silicon film 6 is made greater than 10:1 by using $CF_4+CHF_3$ gas as etching gas thereby to leave the polycrystalline silicon film 6 exposed within the contact hole 9.

Figure 5:
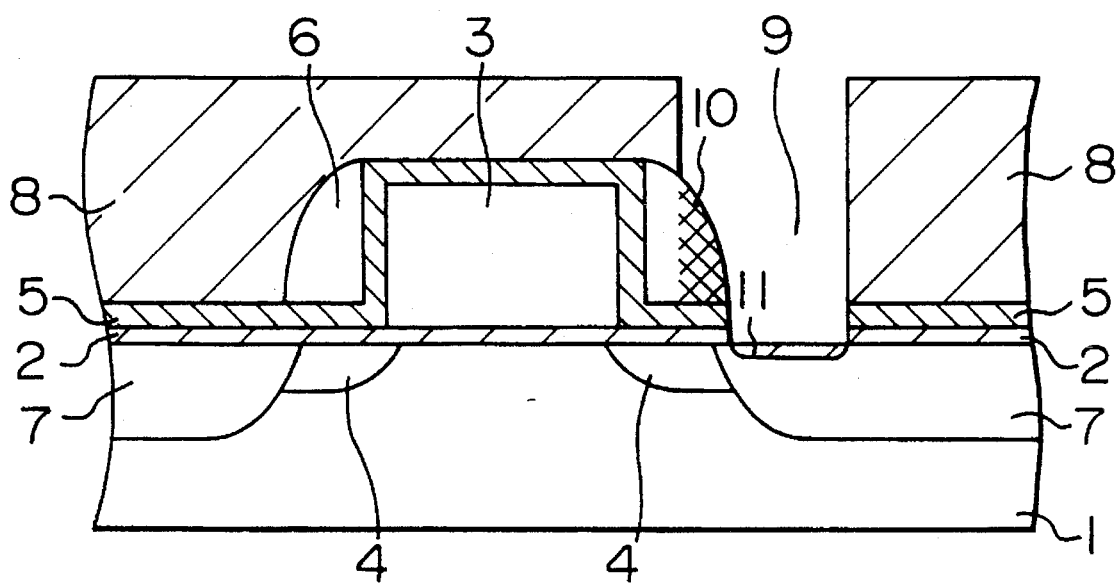

Next a surface portion of the side wall 6 made of polycrystalline silicon exposed within the contact hole 9 is oxidized to form a silicon dioxide wall layer 10 by effecting an oxidizing processing for 30 to 60 minutes at 800° to 1100° C. in a water vapor or oxygen atmosphere by the well-known thermal oxidation method (FIG. 5).

At this time the surface of the substrate within the contact hole 9 is also oxidized. However, since oxidation speed of the surface of the substrate is lower than that of the polycrystalline silicon film, only a thin silicon dioxide film 11 is formed on the surface of the substrate, as indicated in FIG. 5.

Figure 6:
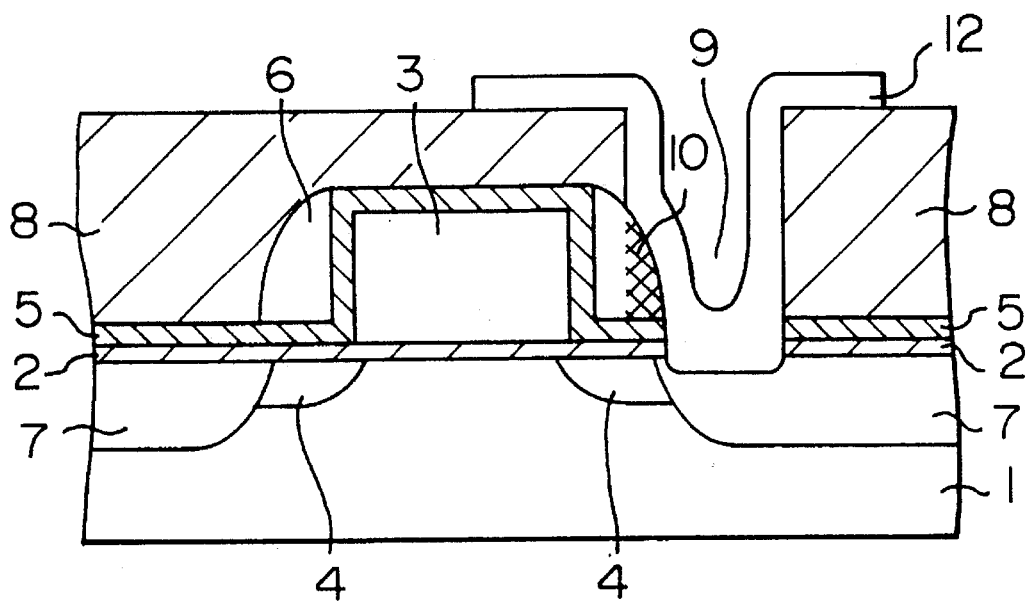

Then, as indicated in FIG. 6, the silicon dioxide film 11 formed on the surface of the semiconductor substrate within the contact hole 9 is removed by the well-known etching method and thereafter a polycrystalline silicon film 12 serving as an electrode or a capacitive element is formed within the contact hole 9 and on the interlayer film 8 in the neighborhood thereof. At this time the silicon dioxide film 10 formed by oxidizing the surface of the polycrystalline silicon side wall 6 having a low impurity concentration is also etched. However, since the etching speed is lower for this part than for the silicon dioxide film 11 formed by oxidizing the surface of the n+ type diffused layer having a high impurity concentration by about 3 to 5 times, even if they are etched simultaneously, only the silicon dioxide film 10 remains.

Next the polycrystalline silicon film 12 is doped with phosphor ions P or arsenic ions As at a concentration of $4 \times 10^{20}$ to $6 \times 10^{20}$ atms/cm$^3$ by the well-known ion implantation method or thermal diffusion.

Thereafter the polycrystalline silicon film 12 is formed in a predetermined shape by the well-known fine processing method. In this case, instead of the polycrystalline silicon film 12, metal wiring made of Al, Cu, Ti, W or an alloy thereof may be formed by the well-known sputtering method or the chemical vapor deposition method so as to be 200 to 800 nm thick.

Further, in the case where the polycrystalline silicon film 12 described above is used as a capacitive element, a dielectric film 13 obtained by forming a silicon nitride film on a silicon dioxide film and further another silicon dioxide film on the silicon nitride film is formed on the polycrystalline silicon film 12 in the semiconductor device indicated in FIG. 6 by the well-known chemical vapor deposition method or the thermal oxidation method to a thickness of about 5 to 10 nm.

Next a polycrystalline silicon film is formed on the dielectric film 13 by the well-known chemical vapor deposition method to have a thickness of about 100 to 200 nm and doped with phosphor ions P as impurities and then processed in the shape to form a plate electrode 14.

Thereafter a second interlayer insulating film 15 made of silicon dioxide or silicon dioxide doped with impurities of P or B is formed on the plate electrode 14 by the well-known chemical vapor deposition method and then a second contact hole 17 is formed therein by the well-known fine processing method.

Figure 7:
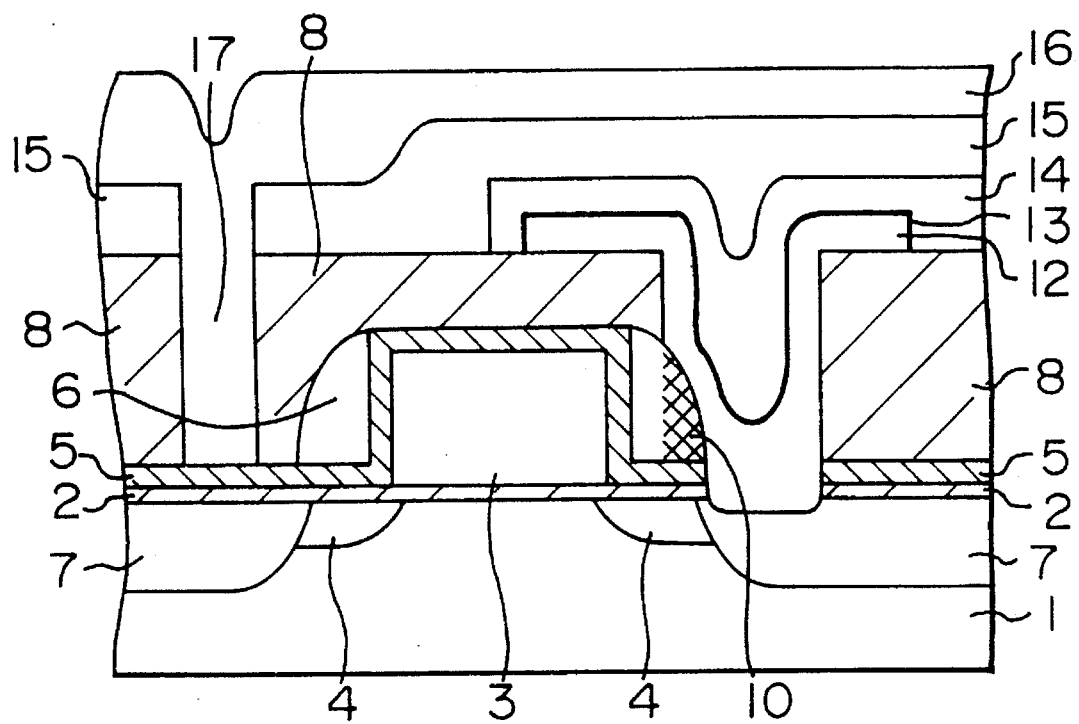

Next metal wiring 16 being 600 to 1000 nm thick is formed by the well-known sputtering method, using a material such as Al, Cu, Ti, W, and the like (FIG. 7).

In the case where a part of the surface of the side wall 6 is exposed within the second contact hole 17 after having formed the hole 17, the exposed part of the surface of the side wall 6 is transformed into a silicon dioxide side wall 10 by effecting thermal oxidation similar to that indicated in FIG. 5.

As explained above, according to the present invention, it is possible to increase an etching selectivity ratio with respect to the interlayer insulating film and the side wall and to prevent etching away of the side wall before the surface of the substrate is exposed, when the contact hole is formed by subjecting the interlayer insulating film to the fine processing method. Further, since the oxide film was formed by oxidizing a part of the surface of the side wall exposed within the contact hole after the formation of the contact hole, it is possible to prevent leak current between the gate electrode and the wiring formed later. For the reasons described above, even if dimensions of the space between the gate electrode and the contact hole are decreased with increasing integration of the device, there is no fear of occurrence of leak current and thus it is possible to provide a semiconductor device having a high reliability and at the same time to provide a method of high fabrication yield for fabricating the semiconductor device.

I claim:

1. A semiconductor device comprising:
   a semiconductor substrate having a first conductivity type;
   a pair of spaced diffused layers having a second conductivity type different from said first conductivity type and being formed in surface portions of said semiconductor substrate;
   a gate electrode formed on a channel region between said pair of diffused layers in said semiconductor substrate with an intermediate gate oxide layer disposed therebetween;
   a silicon dioxide film formed so as to cover an upper surface and side surfaces of said gate electrode and surface portions of said substrate in which said pair of diffused layers is formed;
   a side wall made of polycrystalline silicon and formed to cover said silicon dioxide film on each of the side surfaces of said gate electrode;
   an interlayer insulating film formed to cover said silicon dioxide film, said side wall and said substrate; and
   a contact hole formed through said interlayer insulating film to reach one of said pair of diffused layers, wherein a part of said side wall is exposed within said contact hole and a surface of the exposed part of said side wall is oxidized.

2. A semiconductor device according to claim 1, wherein each of said pair of diffused layers includes a low impurity concentration diffused layer on the inner side, which is close to said channel region, and a high impurity concentration diffused layer on the outer side, which is distant from said channel region.

3. A semiconductor device according to claim 1, wherein the surface of the exposed part is oxidized to form a silicon dioxide layer.

4. A semiconductor device according to claim 1, wherein the polycrystalline silicon forming said side wall is doped with impurity.

5. A method of fabricating a semiconductor device comprising the steps of:
   1) forming a gate electrode on a first region of a semiconductor substrate having a first conductivity type with an intermediate gate oxide layer disposed therebetween and forming diffused layers having a second conductivity type different from said first conductivity type in a pair of second regions of the semiconductor substrate between which said first region is disposed;
   2) forming a silicon dioxide film and a polycrystalline silicon film one after another on an upper surface and two side surfaces of said gate electrode and said pair of second regions of said substrate and forming a side wall on each of said side surfaces of said gate electrode by etching away parts of said polycrystalline silicon film other than parts thereof formed on said two side surfaces of said gate electrode;
   3) forming an interlayer insulating film on said silicon dioxide film and said polycrystalline silicon film and forming a contact hole reaching one of said second regions of said substrate through said interlayer insulating film so as to expose a part of said side wall therein; and
   4) oxidizing the exposed part of said side wall thereby forming a silicon dioxide film at a surface of the exposed part of said side wall.

6. A method of fabricating a semiconductor device according to claim 5, wherein the diffused layers having the second conductivity type are low impurity concentration diffused layers and wherein high impurity concentration diffused layers having said second conductivity type are formed on the outer side of said pair of low impurity concentration diffused layer, distant from said first region.

7. A method of fabricating a semiconductor device according to claim 5, further including doping said polycrystalline silicon film with impurities.

8. A method of fabricating a semiconductor device according to claim 5, wherein the part of said side wall exposed within said contact hole is oxidized by thermal oxidation.

9. A method of fabricating a semiconductor device comprising:
   providing a semiconductor substrate having a first conductivity type;
   forming a pair of spaced diffused layers having a second conductivity type different from said first conductivity type in surface portions of said semiconductor substrate;
   forming a gate electrode on a channel region between said pair of diffused layers in said semiconductor substrate with an intermediate gate oxide layer disposed therebetween;
   forming a silicon dioxide film layer to cover an upper surface and side surfaces of said gate electrode and surface portions of said substrate in which said pair of diffused layers are formed;
   forming a side wall made of polycrystalline silicon to cover said silicon dioxide film on each of the side surfaces of said gate electrode;
   forming an interlayer insulating film of silicon dioxide to cover said silicon dioxide film layer, said side wall and said substrate;

forming a contact hole through said interlayer insulating film to reach one of said pair of diffused layers, so that a part of said side wall is exposed within said contact hole due to the etching selectivity ratio between said interlayer insulating film and said side wall; and oxidizing a surface of the exposed part of said side wall to form a silicon dioxide film thereon.

* * * * *